United States Patent
Hung et al.

(10) Patent No.: US 9,711,394 B1
(45) Date of Patent: Jul. 18, 2017

(54) METHOD FOR CLEANING THE SURFACE OF AN EPITAXIAL LAYER IN OPENINGS OF SEMICONDUCTOR DEVICE

(71) Applicant: UNITED MICROELECTRONICS CORP., Hsin-Chu (TW)

(72) Inventors: Yu-Hsiang Hung, Tainan (TW); Ssu-I Fu, Kaohsiung (TW); Chih-Kai Hsu, Tainan (TW); Wei-Chi Cheng, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 15/161,301

(22) Filed: May 23, 2016

(51) Int. Cl.
*H01L 21/00* (2006.01)
*H01L 21/768* (2006.01)

(52) U.S. Cl.
CPC .. *H01L 21/76814* (2013.01); *H01L 21/76805* (2013.01); *H01L 21/76889* (2013.01); *H01L 21/76895* (2013.01)

(58) Field of Classification Search
CPC .......................... H01L 21/28518; H01L 29/665
USPC ........................................................ 438/664
See application file for complete search history.

(56) References Cited

U.S. PATENT DOCUMENTS

| | | | | |
|---|---|---|---|---|
| 5,508,221 A | * | 4/1996 | Kamiyama | H01L 28/40 257/E21.008 |
| 5,776,822 A | * | 7/1998 | Fujii | H01L 21/28052 257/E21.165 |
| 6,121,139 A | * | 9/2000 | Chang | H01L 21/28518 257/E21.165 |
| 9,230,816 B1 | | 1/2016 | Hung | |
| 2001/0032995 A1 | * | 10/2001 | Maria | H01L 21/28185 257/310 |
| 2002/0123216 A1 | * | 9/2002 | Yokoyama | H01L 21/28518 438/622 |
| 2013/0049107 A1 | * | 2/2013 | So | H01L 29/66734 257/331 |
| 2013/0277769 A1 | | 10/2013 | Tung | |
| 2015/0048460 A1 | * | 2/2015 | Lee | H01L 29/66795 257/384 |
| 2015/0145025 A1 | * | 5/2015 | Yoshida | H01L 29/0696 257/329 |

* cited by examiner

Primary Examiner — Jami M Valentine
(74) Attorney, Agent, or Firm — Winston Hsu

(57) ABSTRACT

A method for fabricating a semiconductor device includes the following steps: providing a substrate having an epitaxial layer, a gate structure and an interlayer dielectric thereon, where the epitaxial structure is disposed at sides of the gate structure and the interlayer dielectric covering the epitaxial structure; forming an opening in the interlayer dielectric so that the surface of the epitaxial layer is exposed from the bottom of the opening; performing a rapid thermal process in an inert environment until non-conductive material is generated on the surface of the epitaxial layer; and removing the non-conductive material.

11 Claims, 7 Drawing Sheets

METHOD FOR CLEANING THE SURFACE OF AN EPITAXIAL LAYER IN OPENINGS OF SEMICONDUCTOR DEVICE

BACKGROUND OF THE INVENTION

1. Field of the Invention

The present invention relates generally to the field of fabricating a semiconductor device, and more particularly to the method of fabricating a semiconductor device which includes the step of cleaning the surface of an epitaxial layer exposed from an opening.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate. However, a more effective cleaning process is still required in order to reduce the contact resistance between the S/D regions and the corresponding contact structure.

SUMMARY OF THE INVENTION

According to one aspect of the present invention, a method for fabricating a semiconductor device includes the following steps: providing a substrate having an epitaxial layer, a gate structure and an interlayer dielectric thereon, where the epitaxial structure is disposed at sides of the gate structure and the interlayer dielectric covering the epitaxial structure; forming an opening in the interlayer dielectric so that the surface of the epitaxial layer is exposed from the bottom of the opening; performing a rapid thermal process in an inert environment until non-conductive material is generated on the surface of the epitaxial layer; and removing the non-conductive material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the embodiments of the present invention and their advantage, reference is now made to the following description, taken in conjunction with accompanying drawings, in which

FIG. 1 is a schematic cross-sectional view of a semiconductor structure having a fin-shaped structure and metal gates according to one embodiment of the invention.

FIG. 2 is a schematic cross-sectional view of a semiconductor structure after forming a patterned photoresist thereon according to one embodiment of the invention.

FIG. 3 is a schematic cross-sectional view of a semiconductor structure after transferring the pattern defined in a patterned photoresist to an underlying dielectric layer according to one embodiment of the invention.

FIG. 4 is a schematic cross-sectional view of a semiconductor structure after conducting a rapid thermal process according to one embodiment of the invention.

FIG. 5 is a schematic cross-sectional view of a semiconductor structure after conducting a cleaning process according to one embodiment of the invention.

FIG. 6 is a schematic cross-sectional view of a semiconductor structure after forming a silicide layer according to one embodiment of the invention.

FIG. 7 is a schematic cross-sectional view of a semiconductor structure with contact plugs according to one embodiment of the invention.

FIG. 8 is a flow chart of fabricating a semiconductor device in accordance of one embodiment of the present invention.

FIG. 9 is a flow chart of fabricating a semiconductor device in accordance of another embodiment of the present invention.

FIG. 10 is a flow chart of fabricating a semiconductor device in accordance of still another embodiment of the present invention.

DETAILED DESCRIPTION

Figure 1:
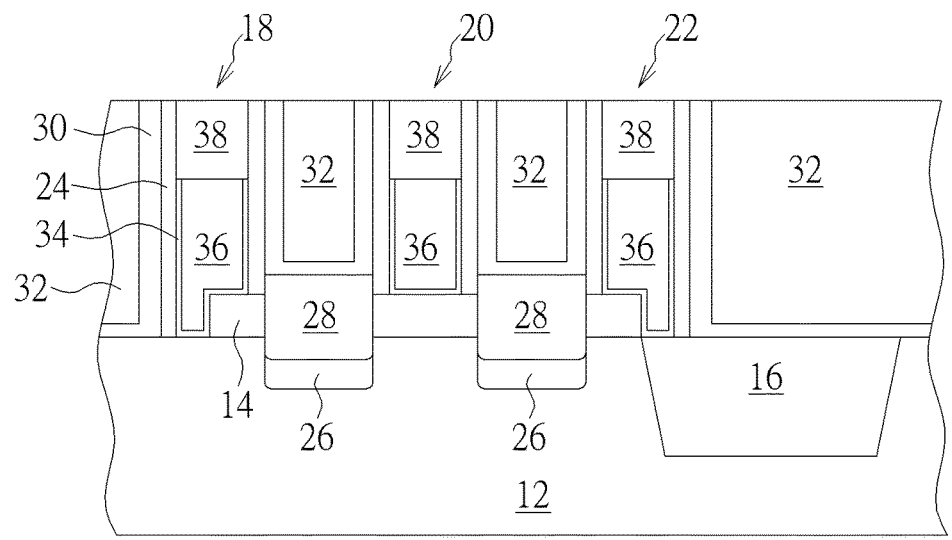
FIGS. 1-10 illustrate a method for fabricating semiconductor device according to preferred embodiments of the present invention, where.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of components and regions may be exaggerated for clarity unless express so defined herein.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, the method for fabricating a semiconductor device including the step of cleaning the surface of an epitaxial layer exposed from an opening is disclosed in detail.

Referring to FIGS. 1-8, FIGS. 1-8 illustrate a method for fabricating semiconductor device according to a preferred embodiment of the present invention. It should be noted despite this embodiment pertains to a non-planar MOS transistor, the method of the present invention could be applied to either planar or non-planar transistor devices depending on the demand of the product. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer are formed on the substrate 12, in which the bottom of the fin-shapes structure 14 is preferably enclosed by the insulating layer preferably composed of silicon oxide to form a shallow trench isolation (STI) 16. Gate structures 18, 20, 22 are formed on part of the fin-shaped structure 14.

The formation of the fin-shaped structure 14 could include first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form a STI 16 surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form a STI 16 to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI 16 could be eliminated.

The fabrication of the gate structures 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the STI 16, and a spacer 24 is formed on the sidewall of the dummy gates. A source/drain region 26 and epitaxial layer 28 are then formed in the fin-shaped structure 14 and/or substrate 12 adjacent to two sides of the gate structure gate structures 18, 20, 22. A contact etch stop layer (CESL) 30 is formed on the dummy gates, and an interlayer dielectric (ILD) layer 32 composed of tetraethyl orthosilicate (TEOS) is formed on the CESL 30. In addition, the interlayer dielectric layer 32 covers the epitaxial layer 28.

Next, a replacement metal gate (RMG) process could be conducted to planarize part of the ILD layer 32 and CESL 30 and then transforming the dummy gate into a metal gates 18, 20, 22. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gate for forming a recess (not shown) in the ILD layer 32. Next, a conductive layer including at least a U-shaped work function metal layer 34 and a low resistance metal layer 36 is formed in the recess, and a planarizing process is conducted thereafter so that the surface of the U-shaped work function metal layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the gate structures 18, 20, 22, part of the work function metal layer 34 and low resistance metal layer 36 could be removed, and a hard mask 38 is formed on the work function metal layer 34 and the low resistance metal layer 36. The hard mask 38 could be a single material layer or composite material layer, such as a composite layer containing both silicon oxide and silicon nitride.

Figure 2:
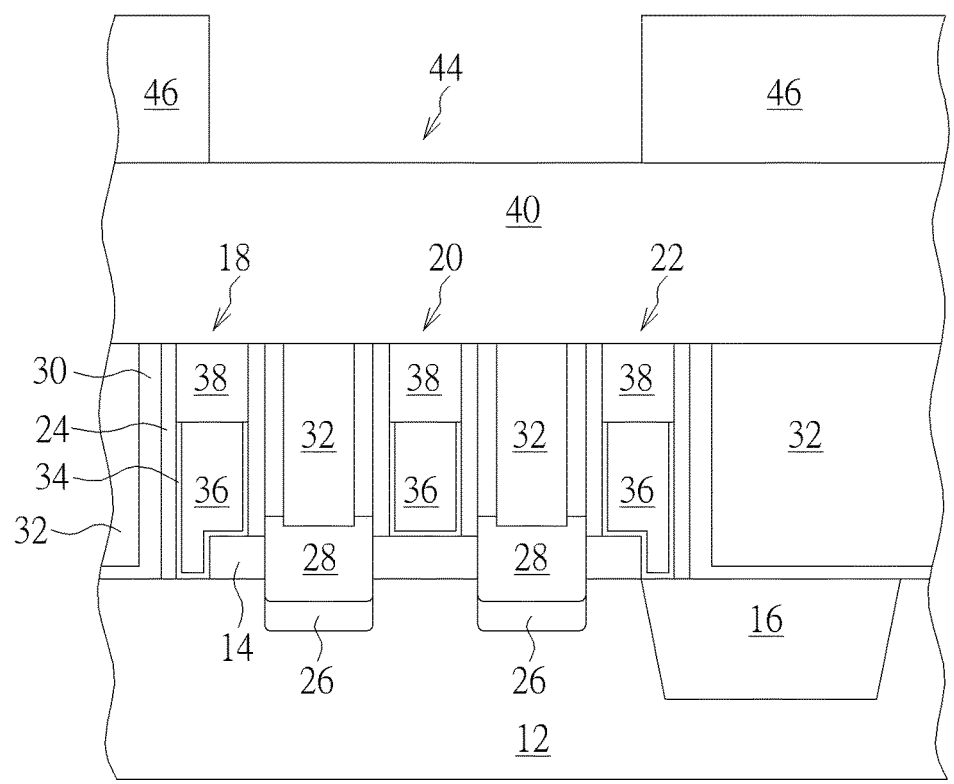

Next, as shown in FIG. 2, a dielectric layer 40 entirely covers the gate structures 18, 20, 22 and ILD layer 32. In this embodiment, the dielectric layer 40 is preferably used as a pre-metal dielectric (PMD) layer, in which the dielectric layer 40 and ILD layer 32 could be composed of same or different material, such as TEOS. The patterned mask 42 is preferably a metal hard mask composed of TiN. Next, a photolithographic process is carried out to form a patterned photoresist 46 on the surface of the dielectric layer 40. The patterned photoresist 46 and the underlying hard masks 38 may be used to define the locations of openings between the gate structures 18, 20, 22.

Figure 3:
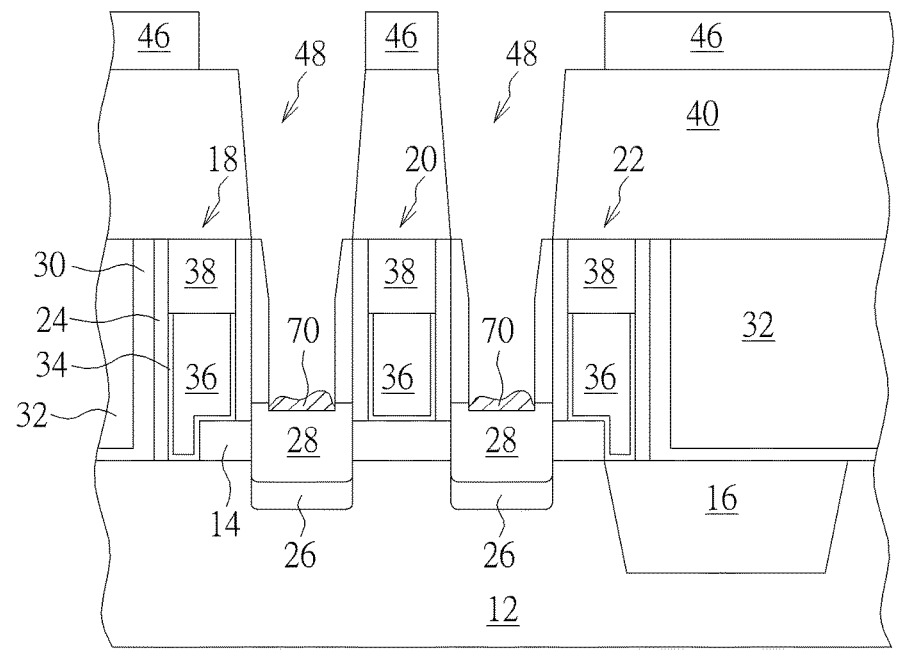
Figure 4:
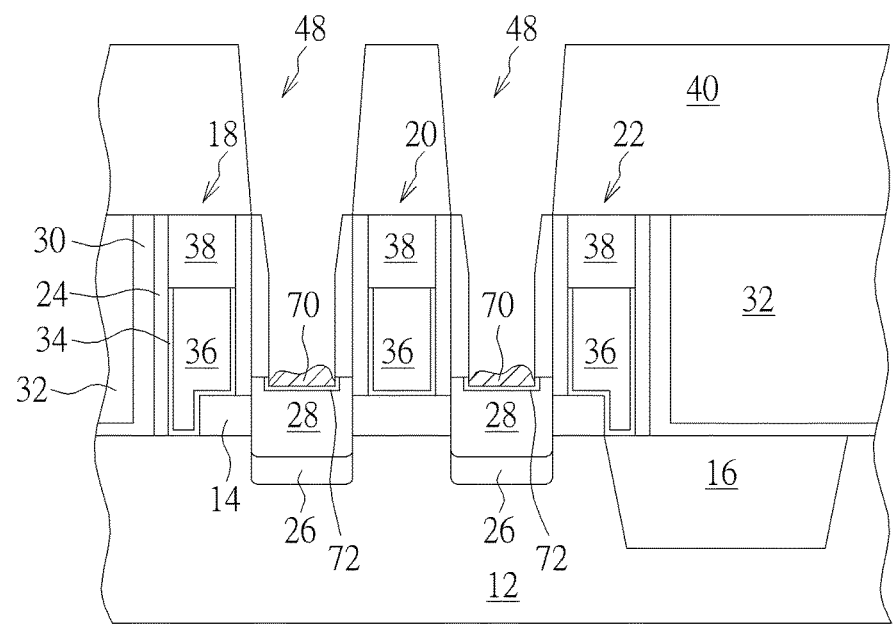
Figure 5:
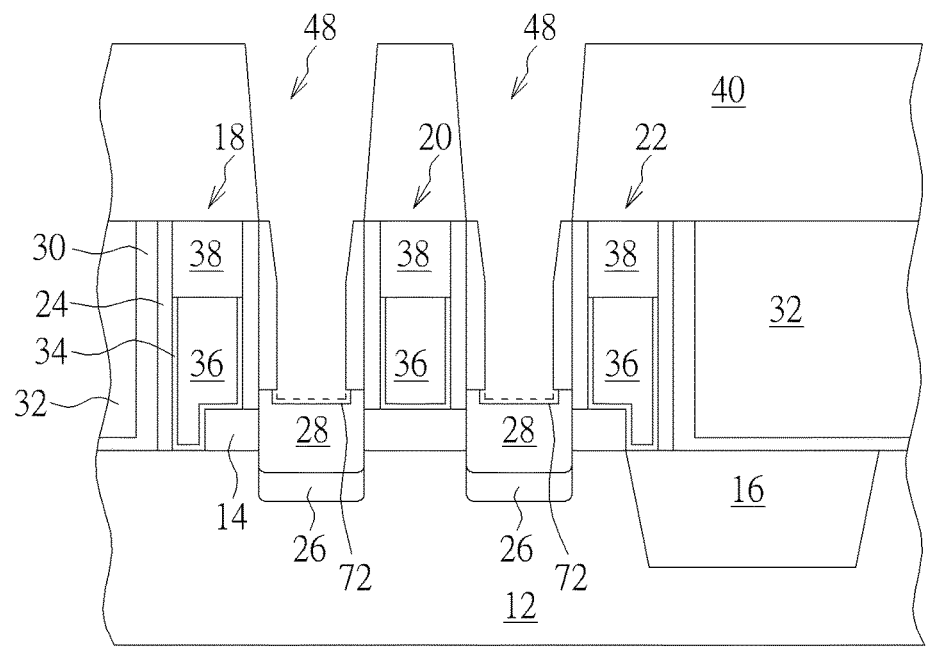

Next, as shown in FIG. 3, one or more etching processes may be conducted so as to transfer the pattern defined in the patterned photoresist 46 to the underlying dielectric layer 40. When the etching process is completed, openings 48 may be formed in the dielectric layer 40 and the ILD layer 32, and the top surface of each epitaxial layer 28 may be partially exposed from the bottom of the opening 48. During the etching process, some residues 70, such as organic residues, may be generated and deposited on the sidewalls of the opening 48 and on the surface of the epitaxial layer 28 exposed from the bottom of the opening 48. Then, the patterned photoresist 46 is further removed.

Then, a rapid thermal process is conducted in an inert environment made of $N_2$, $H_2$, and/or Ar, or in vacuum environment at the temperature of 400-750° C. During the rapid thermal process, the non-conductive material 72 is generated on the surface of the epitaxial layer 28 and under the residues 70.

Next, one or more cleaning processes are conducted to remove the non-conductive material 72 along with the residues 70. The cleaning processes may include wet etching processes through which the non-conductive material 72 may be dissolved in an aqueous cleaning solution. In one aspect of the prevent invention, the cleaning processes may include a two-step cleaning process including the steps of: (1) applying diluted hydrofluoric acid (DHF) into the opening; and (2) applying an aqueous mixture of sulfuric acid ($H_2SO_4$) and hydrogen peroxide ($H_2O_2$) into the openings 48. When the non-conductive material 72 is composed of oxide, it can be easily dissolved by diluted hydrofluoric acid. Since the residues 70 are directly disposed on the surface of the non-conductive material 72, they are supposed to be removed concurrently during the step of dissolving the non-conductive material 72. It should be noted that, in another aspect of the prevent invention, the cleaning processes for removing the residues 70 and non-conductive material 72 may be conducted in gas environment rather than liquid environment. Besides, in still another aspect of the prevent invention, the cleaning processes for removing the residues 70 and non-conductive material 72 may be a pre-clean process used to remove remaining particles from the surface of the dielectric layer 40 and epitaxial layer 28.

Figure 6:
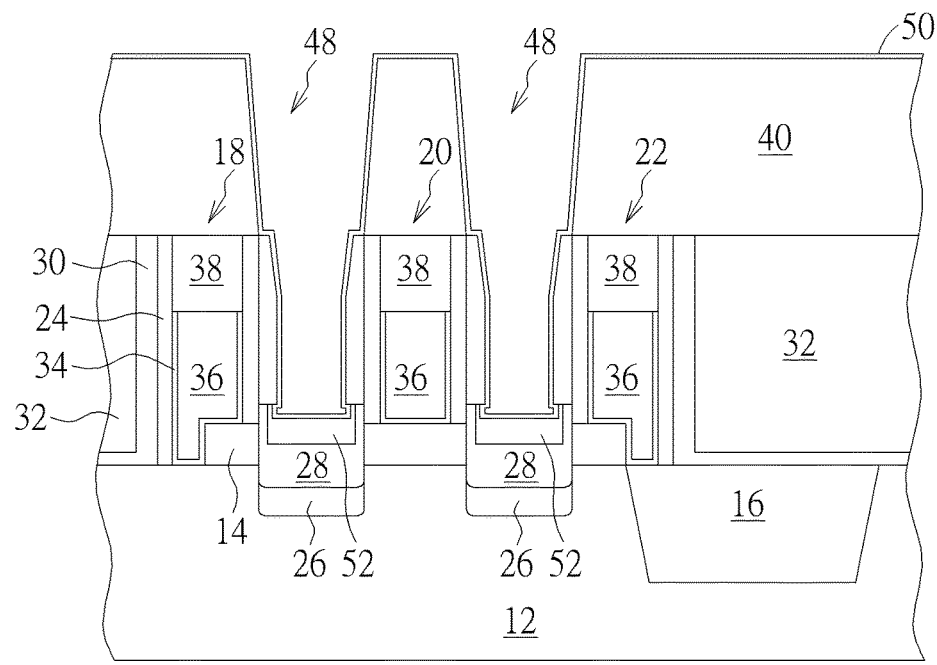

Next, as shown in FIG. 6, a first metal layer 50 is deposited on the dielectric layer 40, and the sidewalls and bottoms of the openings 48. In this embodiment, the first metal layer 50 is preferably composed of Ni or Ti, but not limited thereto. A selective cap layer (not shown) composed of TiN could then be formed on the first metal layer 50 thereafter. Next, a rapid thermal anneal (RTA) process is conducted so that the first metal layer 50 would react with silicon within the epitaxial layer 28 to form a silicide layer 52. It should be noted that since the first metal layer 50 contacting the epitaxial layer 28 is transformed into silicide layer 52 entirely during the RTA process, the remaining first metal layer 50, or the un-reacted metal from the silicide process would still remain on the surface of the dielectric layer 40 and the surface of the CESL 30 inside the openings 48.

Next, a sulfuric acid-hydrogen peroxide mixture (SPM) is utilized to remove the un-reacted metal from the silicide process and the remaining first metal layer 50 on the dielectric layer 40 and inside the openings 48.

Figure 7:
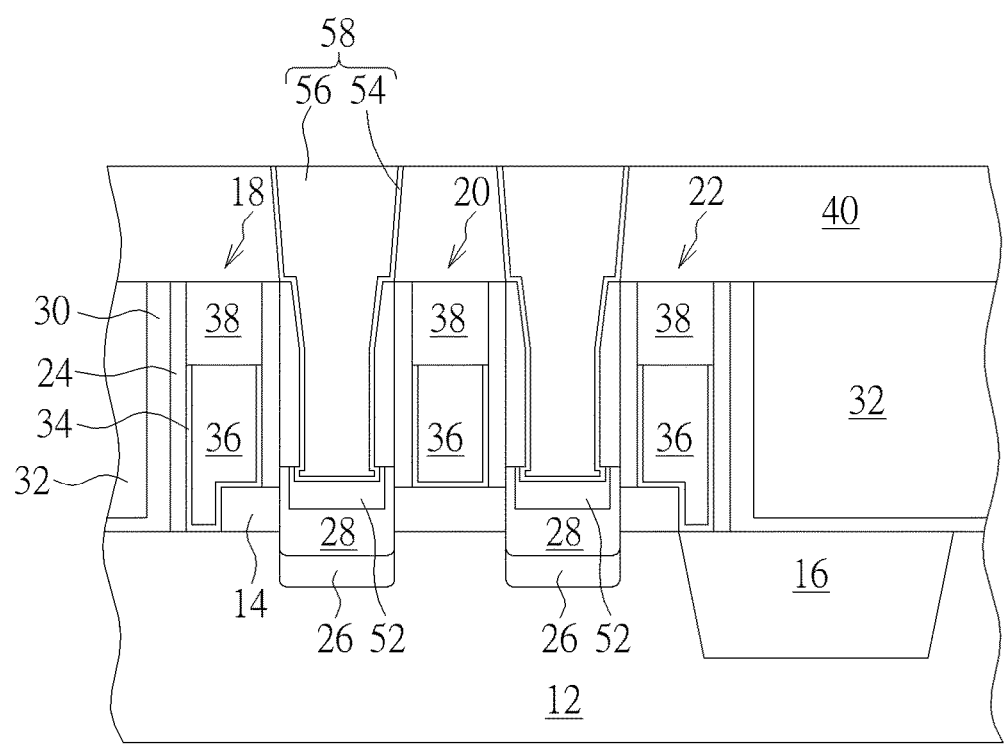

Next, as shown in FIG. 7, a second metal layer 54 is formed on the dielectric layer 40 surface, CESL 30, and silicide layer 52, and a third metal layer 56 is formed on the second metal layer 54 and in the openings 48, in which the second metal layer 54 is selected from the material consisting of Ta, Ti, TiN, TaN, and WN, and the third metal layer 56 is selected from the material consisting of Al, Ti, Ta, W, Nb, Mo, and Cu, but not limited thereto. Next, a planarizing process, such as a chemical mechanical polishing (CMP) process is conducted to remove part of the third metal layer 56, part of the second metal layer 54, and even part of the dielectric layer 40 to form contact plugs 58. This completes the fabrication of a semiconductor device according to a preferred embodiment of the present invention. It should be noted that, since there is no residue between the contact plugs 58 and the underlying S/D regions 26, the contact resistance between them can be reduced effectively.

Figure 8:
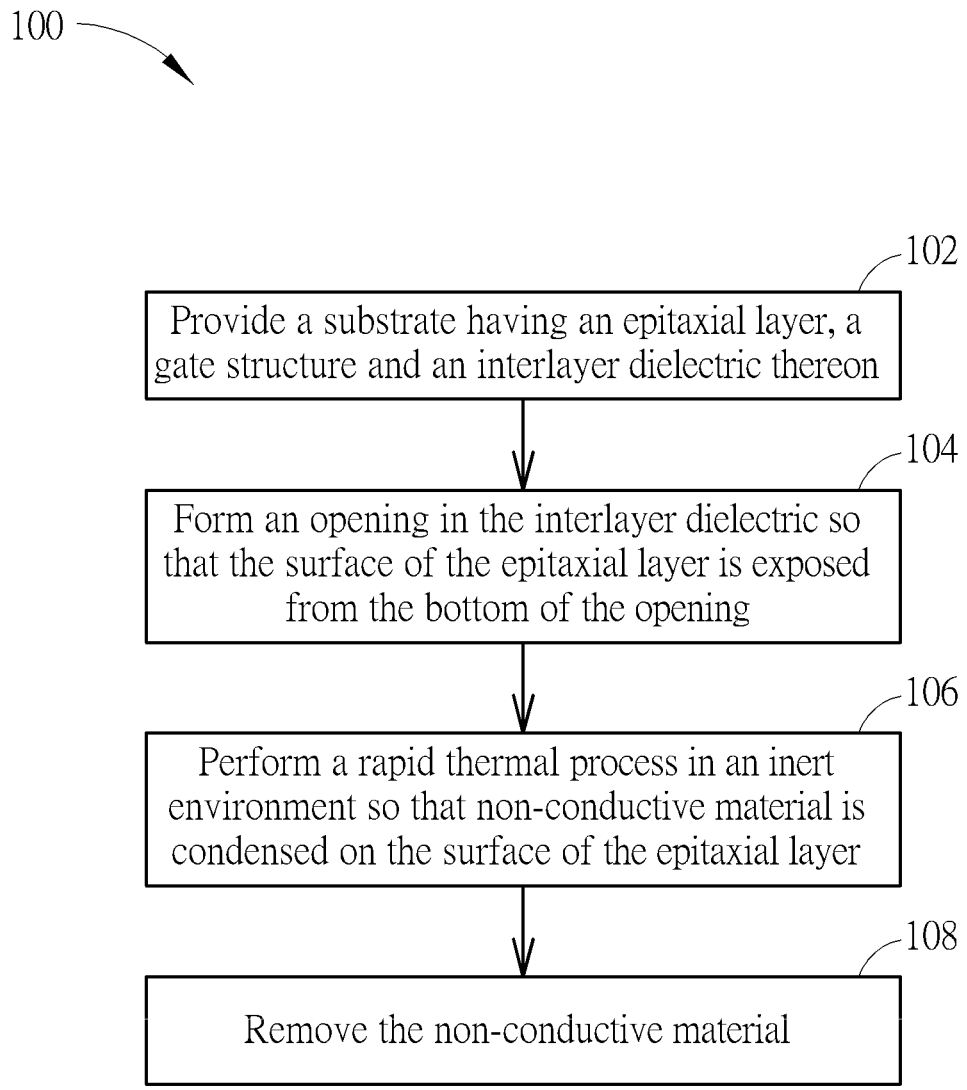

FIG. 8 is a flow chart of fabricating a semiconductor device in one aspect of the present invention, which includes the following steps: (1) step 102: providing a substrate having an epitaxial layer, a gate structure and an interlayer dielectric thereon; (2) step 104: forming an opening in the interlayer dielectric so that the surface of the epitaxial layer is exposed from the bottom of the opening; (3) step 106: performing a rapid thermal process in an inert environment so that non-conductive material is condensed or generated on the surface of the epitaxial layer; and (4) step 108: removing the non-conductive material. It should be note that other steps may be added before, between, or after each of the steps described above according to different fabrication requirements.

Figure 9:
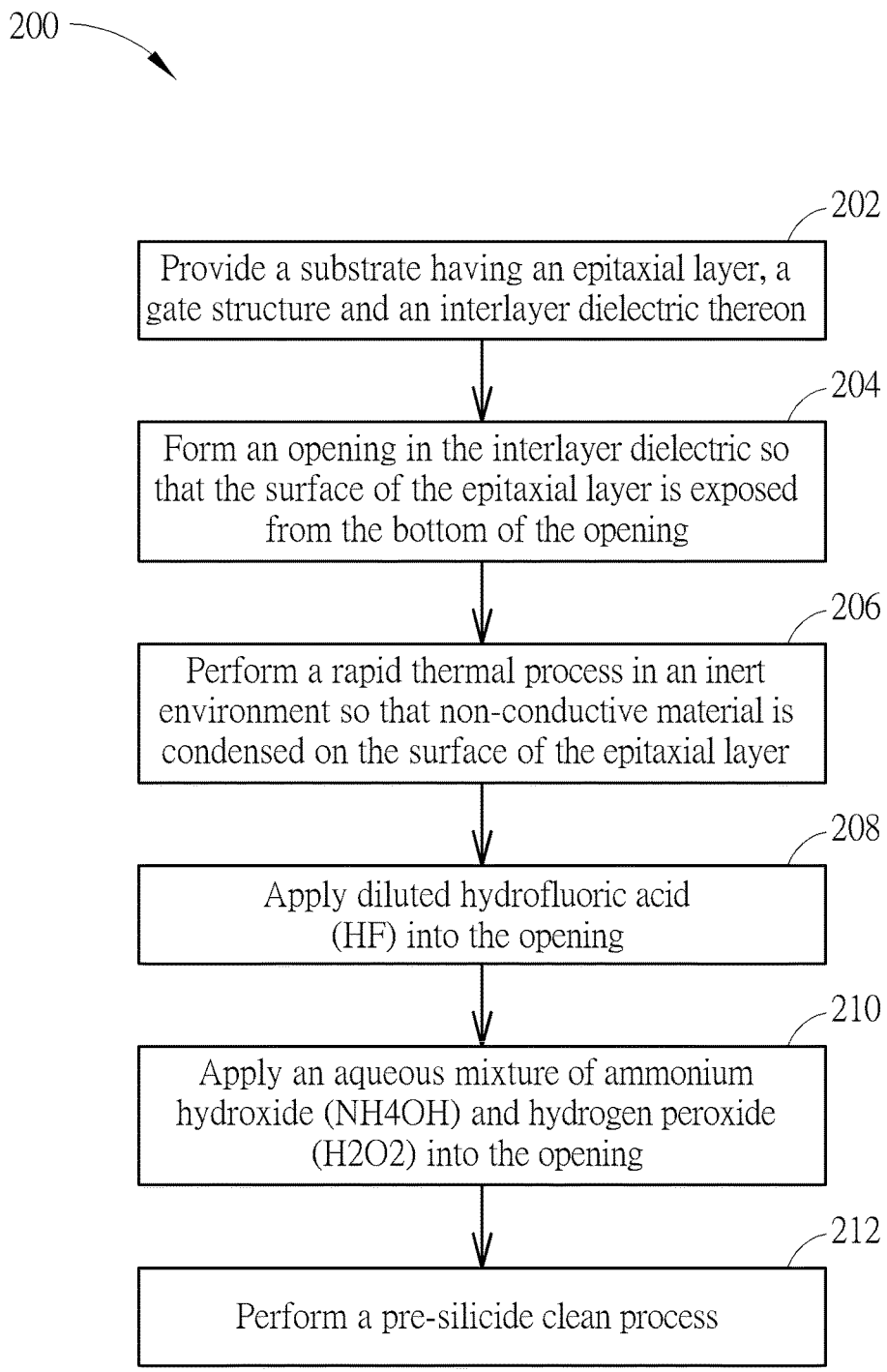

FIG. 9 is a flow chart of fabricating a semiconductor device in another aspect of the present invention, which includes the following steps: (1) step 202: providing a substrate having an epitaxial layer, a gate structure and an interlayer dielectric thereon; (2) step 204: forming an opening in the interlayer dielectric so that the surface of the epitaxial layer is exposed from the bottom of the opening; (3) step 206: performing a rapid thermal process in an inert environment so that non-conductive material is condensed or generated on the surface of the epitaxial layer; (4) step 208: applying diluted hydrofluoric acid (HF) into the opening; (5) step 210: applying an aqueous mixture of ammonium hydroxide ($NH_4OH$) and hydrogen peroxide ($H_2O_2$) into the opening; and (6) step 212: performing a pre-silicide clean process. It should be note that other steps may be added before, between, or after each of the steps described above according to different fabrication requirements.

Figure 10:
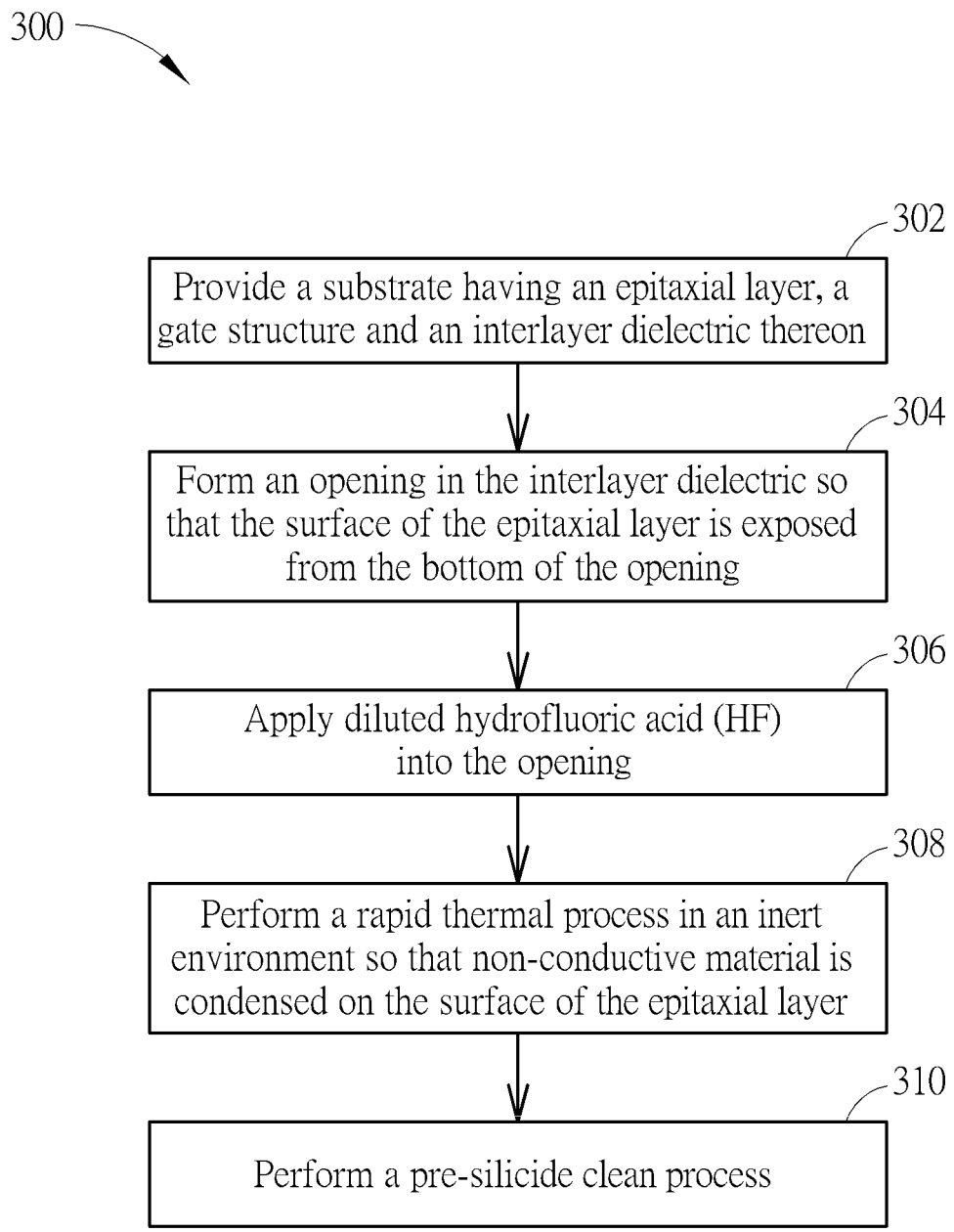

FIG. 10 is a flow chart of fabricating a semiconductor device in still another aspect of the present invention, which includes the following steps: (1) step 302: providing a substrate having an epitaxial layer, a gate structure and an interlayer dielectric thereon; (2) step 304: forming an opening in the interlayer dielectric so that the surface of the epitaxial layer is exposed from the bottom of the opening; (3) step 306: applying diluted hydrofluoric acid (HF) into the opening; (4) step 308: performing a rapid thermal process in an inert environment so that non-conductive material is condensed or generated on the surface of the epitaxial layer; (5) step 310: performing a pre-silicide clean process. It should be note that other steps may be added before, between, or after each of the steps described above according to different fabrication requirements.

In sum, in one aspect of the present invention, the rapid thermal process is conducted to condense or generate the non-conductive material. The non-conductive material is a thin layer formed on the surface of the epitaxial layer and under the residue. Since the residue is disposed directly on the non-conductive material, it may also be removed concurrently along with the non-conductive material during the step of removing the non-conductive material. Thus, the contact resistance between the contact plugs and the S/D regions can be reduced effectively due to all the residue at the bottom of the opening is removed completely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    providing a substrate having an epitaxial layer, a gate structure and an interlayer dielectric thereon, wherein the epitaxial layer is disposed at sides of the gate structure and the interlayer dielectric covering the epitaxial layer;
    forming an opening in the interlayer dielectric, whereby the surface of the epitaxial layer is exposed from the bottom of the opening;
    applying an aqueous mixture of ammonium hydroxide ($NH_4OH$) and hydrogen peroxide ($H_2O_2$) into the opening;
    after applying the aqueous mixture, performing a rapid thermal process in an inert environment, whereby non-conductive material is generated on the surface of the epitaxial layer; and
    removing the non-conductive material.

2. The method for fabricating a semiconductor device of claim 1, wherein the rapid thermal process is performed at the temperature about 400-750° C.

3. The method for fabricating a semiconductor device of claim 1, further comprising applying an aqueous mixture of sulfuric acid ($H_2SO_4$) and hydrogen peroxide ($H_2O_2$) into the opening before the step of performing the rapid thermal process.

4. The method for fabricating a semiconductor device of claim 1, further comprising applying diluted hydrofluoric acid (HF) into the opening before the step of performing the rapid thermal process.

5. The method for fabricating a semiconductor device of claim 1, wherein the step of removing the non-conductive material comprises applying diluted hydrofluoric acid (HF) into the opening.

6. The method for fabricating a semiconductor device of claim 1, wherein the step of removing the non-conductive material comprises:
    applying diluted hydrofluoric acid (HF) into the opening; and
    applying an aqueous mixture of ammonium hydroxide ($NH_4OH$) and hydrogen peroxide ($H_2O_2$) into the opening.

7. The method for fabricating a semiconductor device of claim 1, further comprising forming a patterned photoresist layer on the interlayer dielectric before the step of forming the opening in the interlayer dielectric.

8. The method for fabricating a semiconductor device of claim 1, further comprising depositing an organic residue on the surface of the epitaxial layer exposed from the bottom of the opening.

9. The method for fabricating a semiconductor device of claim 8, wherein the organic residue is on the surface of non-conductive material when the step of performing the rapid thermal process in the inert environment is completed.

10. The method for fabricating a semiconductor device of claim 8, further comprising removing the organic residue during the step of removing the non-conductive material.

11. The method for fabricating a semiconductor device of claim 1, wherein the step of removing the non-conductive material comprises dissolving the non-conductive material in an aqueous solution.

* * * * *